United States Patent
Beschnitt et al.

(10) Patent No.: US 12,477,670 B2
(45) Date of Patent: Nov. 18, 2025

(54) EXTENDABLE AND RETRACTABLE DISPLAY DEVICE FOR A VEHICLE

(71) Applicant: BEHR-HELLA THERMOCONTROL GMBH, Lippstadt (DE)

(72) Inventors: Alexander Beschnitt, Lippstadt (DE); Björn Landgräber, Lippstadt (DE)

(73) Assignee: BEHR-HELLA THERMOCONTROL GMBH, Lippstadt (DE)

( * ) Notice: Subject to any disclaimer, the term of this patent is extended or adjusted under 35 U.S.C. 154(b) by 224 days.

(21) Appl. No.: 18/018,111

(22) PCT Filed: Sep. 23, 2021

(86) PCT No.: PCT/EP2021/076135
§ 371 (c)(1),
(2) Date: Jan. 26, 2023

(87) PCT Pub. No.: WO2022/063866
PCT Pub. Date: Mar. 31, 2022

(65) Prior Publication Data
US 2023/0269889 A1     Aug. 24, 2023

(30) Foreign Application Priority Data

Sep. 23, 2020 (DE) .................. 10 2020 124 829.6
Sep. 24, 2020 (DE) .................. 10 2020 124 958.6

(51) Int. Cl.
*H05K 5/02* (2006.01)
*B60K 35/22* (2024.01)
*B60K 35/53* (2024.01)

(52) U.S. Cl.
CPC ......... *H05K 5/0217* (2013.01); *B60K 35/223* (2024.01); *B60K 35/53* (2024.01); *B60K 35/22* (2024.01)

(58) Field of Classification Search
CPC .................. H05K 5/0017; H05K 5/0217
(Continued)

(56) References Cited

U.S. PATENT DOCUMENTS

| 7,554,062 B2 * | 6/2009 | Lee ............................ B41J 3/46 |
| | | 219/491 |
| 8,953,327 B1 | 2/2015 | Salmon |

(Continued)

FOREIGN PATENT DOCUMENTS

| CN | 110556055 | 12/2019 |
| CN | 111354266 | 6/2020 |

(Continued)

OTHER PUBLICATIONS

Chinese Office Action issued in corresponding Chinese Application No. 202180052962.X dated Sep. 4, 2025.

*Primary Examiner* — Hung S. Bui
(74) *Attorney, Agent, or Firm* — BakerHostetler

(57) ABSTRACT

The extendable and retractable display device is provided with a flexible display foil which is stiffened by a flexible display foil carrier. The display foil and the display foil carrier can be moved into a housing and back out of this housing by being bent. This is implemented by means of at least one actuator, the lower end of which is supported in the housing and the upper end of which is connected to the upper end of the display foil carrier. The housing comprises a guiding means for deflecting the display foil and the display foil carrier when retracting and extending the display.

30 Claims, 12 Drawing Sheets

(58) Field of Classification Search
USPC .................................. 361/807, 809, 810
See application file for complete search history.

(56) References Cited

U.S. PATENT DOCUMENTS

| | | | |
|---|---|---|---|
| 10,769,971 B2 | 9/2020 | Kim et al. | |
| 10,971,696 B2 | 4/2021 | Kim et al. | |
| 2007/0241002 A1* | 10/2007 | Wu | G06F 1/1601 |
| | | | 206/150 |
| 2011/0018820 A1 | 1/2011 | Huitema et al. | |
| 2012/0204453 A1* | 8/2012 | Jung | G09F 9/301 |
| | | | 40/517 |
| 2016/0363960 A1* | 12/2016 | Park | G09F 15/0062 |
| 2017/0217290 A1 | 8/2017 | Yoshizumi et al. | |
| 2019/0098775 A1* | 3/2019 | Cho | H10K 50/841 |

FOREIGN PATENT DOCUMENTS

| | | |
|---|---|---|
| DE | 10 2019 127 570 A | 4/2021 |
| EP | 1 245 429 A2 | 10/2002 |
| EP | 1 637 387 A1 | 3/2006 |

* cited by examiner

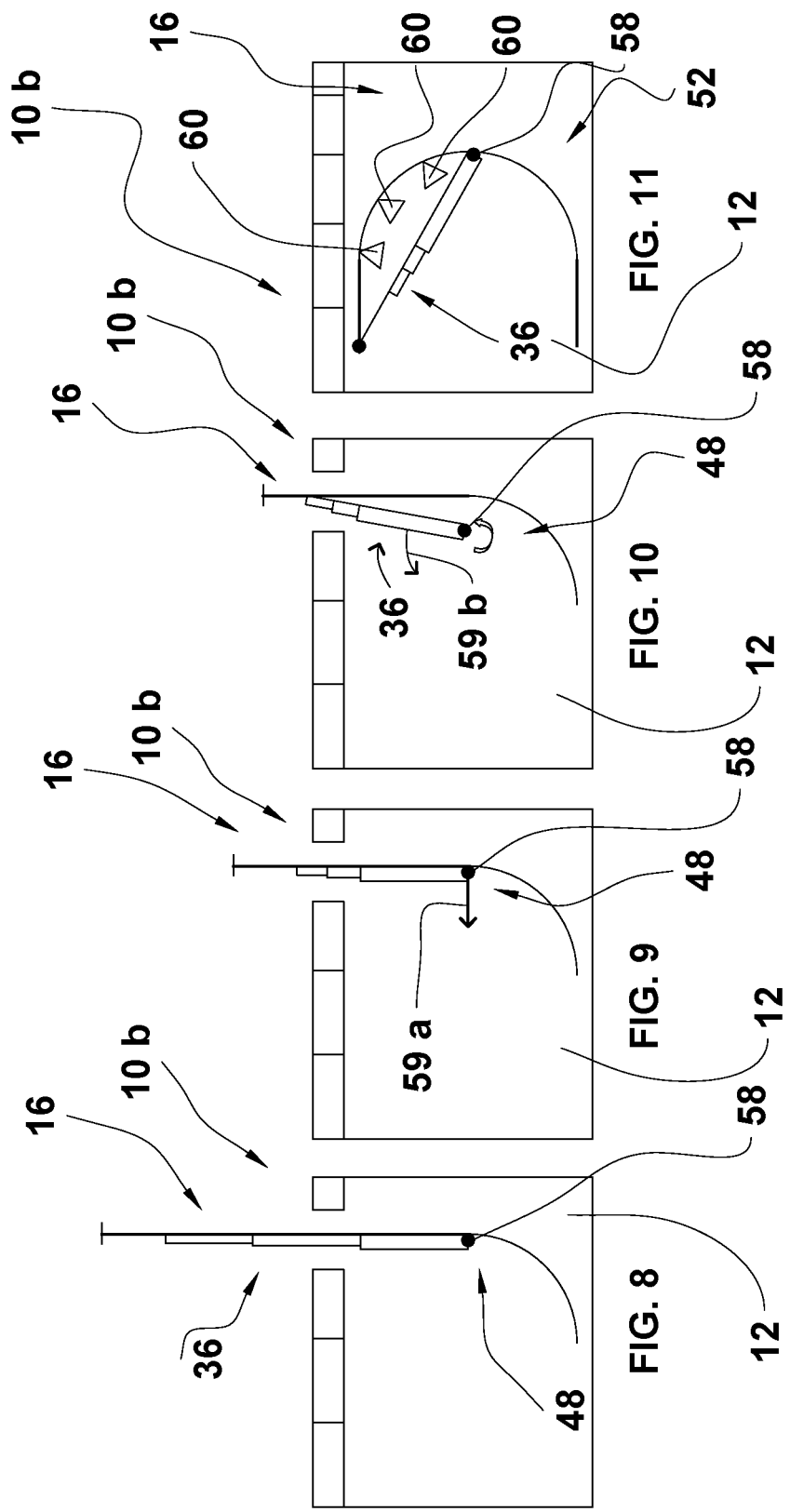

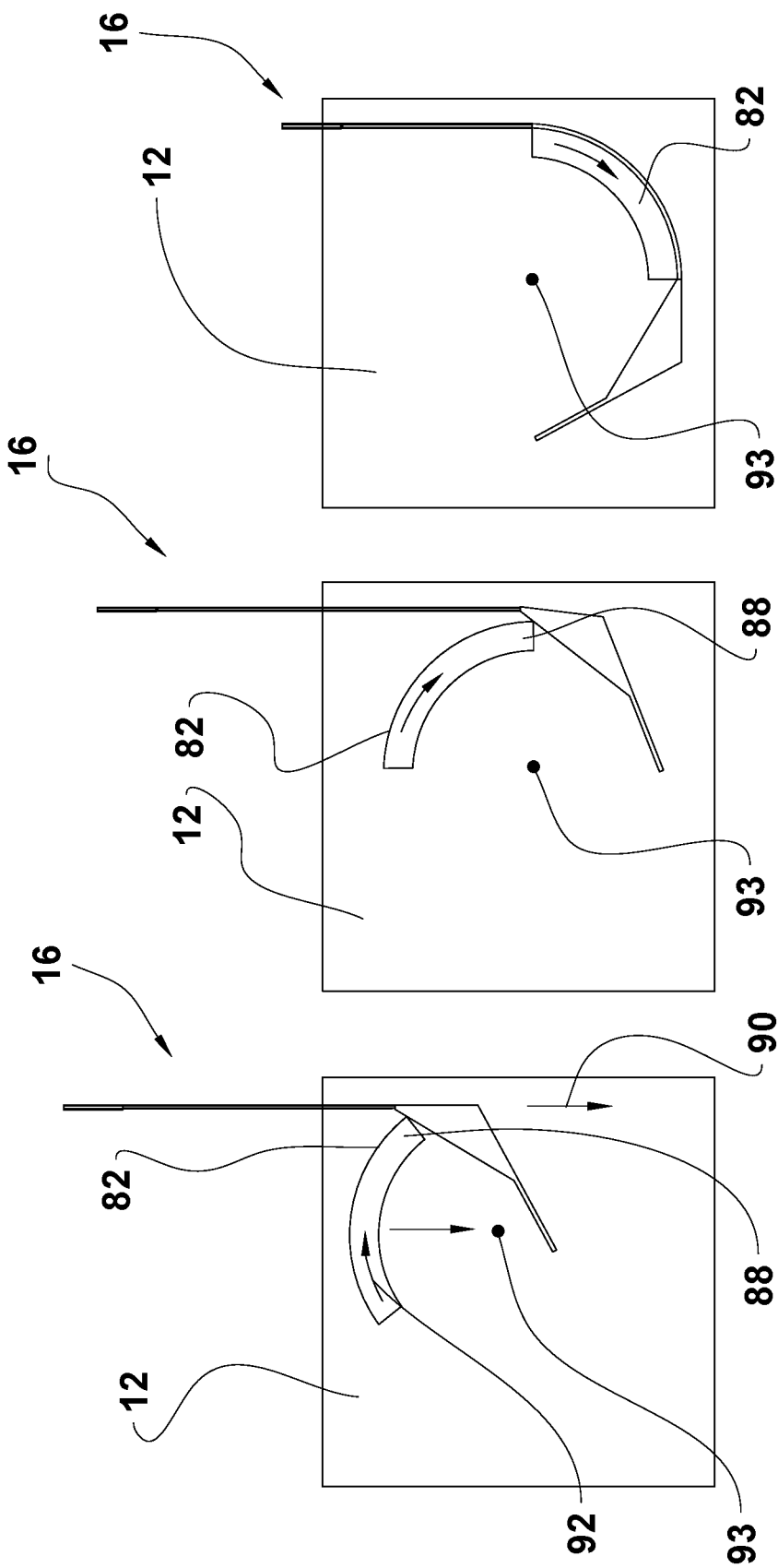

EXTENDABLE AND RETRACTABLE DISPLAY DEVICE FOR A VEHICLE

CROSS-REFERENCE TO RELATED APPLICATIONS

This application is a National Stage of International patent application PCT/EP2021/076135, filed on Sep. 23, 2021, which claims priority to German patent application No. DE 10 2020 124 829.6, filed on Sep. 23, 2020, and DE 10 2020 124 958.6, filed Sep. 24, 2020, the disclosures of which are incorporated herein by reference in their entireties.

TECHNICAL FIELD

The invention relates to an extendable and retractable display device for a vehicle.

BACKGROUND

Recently, TVs with rollable display devices are offered for the consumer sector. In this respect, flexible display foils with OLED technology are used which are partly stiffened with segmented display foil carriers having individual fins.

In the automotive sector, it is sometimes desired to be able to stow away today's common displays when not in use. In this respect, flexible display foils are also suitable for the automotive sector. Extendable and retractable displays for vehicles are known from DE-A-10 2019 127 570, a previously filed and subsequently published German patent application, and from EP-A-1 637 387 as well as from US-A-2017/0217290.

A certain problem with the use of flexible display foils in vehicles is that shocks act on the display device in a vehicle, which are not beneficial to maintaining a stabilization of the flexible display foil in the extended state.

Therefore, it is an object of the present invention to provide an extendable and retractable display device for a vehicle with a flexible display, the stability of which is also given in the extended state in the case of vibrations such as occur while travelling.

SUMMARY OF THE DISCLOSURE

The object of the invention is achieved with the invention providing an extendable and retractable display device for a vehicle, the display device being provided with
 a flexible display foil in OLED technology comprising a front side having a display surface and a rear side and an upper end portion adjoined by a main portion of the display foil extending to a lower end of the display foil, a flexible display foil carrier being attached to the display foil at the rear side thereof or being connected thereto by means of an intermediate layer of, in particular, elastic material and being provided with an upper end portion, which is adjoined by a main portion of the display foil carrier extending to a lower end of the display foil carrier, wherein the upper end portion of the display foil carrier abuts against the upper end portion of the display foil and is stiffened,
 a housing into which the display foil together with the display foil carrier is retractable and out of which the display foil together with the display foil carrier is extendable,
 at least one motorically drivable, length-variable actuator having a first end supported in and/or on the housing and a second end to which the upper end portion of the display foil carrier is attached, and
 a guiding means in the housing for guiding the display foil and the display foil carrier in at least a partial area of their main portions along a radius of curvature of less than 180 degrees or less than 135 degrees or less than 90 degrees during an extension and retraction of at least partial areas of the main portions of the display foil and the display foil carrier out of and into the housing by changing the length of the at least one actuator.

Accordingly, the invention is to be seen in that at least one length-variable actuator, which is motor-driven, is used for extending and retracting the display foil. The flexible display foil is stiffened by a likewise flexible display foil carrier, which can have a metal foil, for example. The flexible display foil implemented in OLED technology has a display surface on its front side and a rear side. At its upper edge, the display foil also has an upper end portion adjoining the upper edge, the upper end portion in turn being adjoined by a main portion extending to the lower edge of the display foil. Similarly, the display foil carrier is (theoretically) divided into an upper end portion and a main portion. The display foil carrier is stiffened in the upper end portion. The at least one motorically drivable, length-variable actuator, which is attached to the rear side of the display foil carrier in its upper end section, engages in this area.

The display device according to the invention also comprises a housing into which the display foil together with the display foil carrier is retractable and out of which the display foil and the display foil carrier are extendable. When the display foil and the display foil carrier are fully retracted, both can still protrude from the housing with at least a part of their upper end portions.

Within the housing is a guiding means for guiding the display foil and the display foil carrier in at least a partial area of their main portion along a radius of curvature, or more generally a line of curvature, extending over less than 180 degrees, or less than 135 degrees, or less than 90 degrees. This guiding means only causes a deflection of the main portions of the display foil and the display foil carrier in the housing and not a winding process, which has the advantage that the curvature to be imparted to the display foil and the display foil carrier can be designed to be greater in the retracted state of the display device. In particular, in the case of a deflection of approximately 90 degrees, for example, the display foil and the display foil carrier continue to run in a straight manner after the deflection, which requires a certain depth of the housing, but this is usually tolerable in terms of installation space conditions, particularly in the area of the instrument panel of a vehicle.

By providing a flexible display foil carrier in foil form made of metal, for example, the flexible display foil can be stabilized over the entire surface. If several length-variable actuators are arranged next to each other and distributed over the width of the display foil and display foil carrier, this results in additional support and thus stabilization of the flexible display foil, so that shocks occurring during driving cannot have an effect in the form of vibrations of the display foil.

In an expedient further development of the invention, it is provided that the at least one actuator has at least two actuator elements arranged between the two ends, wherein neighboring actuator elements are respectively guided so as to be slidable against and/or into one another. Here, telescopic actuators with, for example, spindle drives can be used. However, other length-variable actuator designs with extension drives can also be used.

In order to achieve a length-variable actuator which is as flat as possible, it is advantageous if the actuator comprises a substantially C-shaped first actuator profile element and is provided with a closed side and an open side, a second actuator profile element which is slidably guided in the first actuator profile element, is also substantially C-shaped, and is provided with a closed side and an open side, the closed side of which faces the closed side of the first actuator profile element, and a third actuator profile element which is slidably guided in the second actuator profile element, is substantially C-shaped, and is provided with a closed side and an open side, the closed side of which covers the open side of the second actuator profile element. The C-shaped profile of the individual actuator elements has a substantially straight strip-shaped rear wall, the opposite upper and lower edges of which are bent over to form a "flat C" in cross-section. The nesting of three such elements, as described above, then allows the typically required extension stroke of the display device as encountered in the automotive sector, which in turn is related to the sizes of display that can advantageously be used in the automotive sector.

Instead of using several motorically drivable actuators, additional stiffening and stability of the display device in the extended state can also be achieved by at least one length-variable support having a first end supported in the housing and a second end to which the upper end area of the display foil carrier is attached. Such supports do not have drives, i.e. they are telescopic, for example, or are provided with support elements that are guided in another manner so as to be slidable against one another Also with regard to the configuration of the length-variable support, it may be advantageous if the support comprises a substantially C-shaped first support profile element provided with a closed side and an open side, a second support profile element which is slidably guided in the first support profile element, is also substantially C-shaped and is provided with a closed side and an open side, whose closed side faces the closed side of the first support profile element, and a third support profile element, which is slidably guided in the second support profile element, is substantially C-shaped, and is provided with a closed side and an open side, the closed side of which covers the open side of the second support profile element.

With the help of the at least one motor-drivable actuator and with the help of the support, if present, the display foil can now be held in the stretched state. In this case, the actuator(s) or the support(s), respectively, expediently rest against the rear side of the display carrier and thus support the display foil with respect to forces acting on the display surface. So that the display foil is now also secured against "pull-off forces", it is provided, according to an advantageous further development of the invention, that the at least one actuator or at least one of its support elements and/or, if present, the at least one support or at least one of its support elements has an inner side facing the display foil carrier, on which inner side a receiving groove is formed or arranged, that at least one retaining element is arranged, protruding from the rear side of the display foil carrier facing away from the display foil, in the main portion of said display foil carrier, specifically on an imaginary line which is opposite the receiving groove when the display foil and the display foil carrier are extended and retracted, and that the at least one retaining element immerses into the receiving groove when the display foil and the display foil carrier are extended and moves out of the receiving groove when the display foil and display foil carrier are retracted. Here, it is expedient if the at least one retaining element has a widened or angled end facing away from the display foil carrier for engaging behind a receiving slot of the receiving groove. The receiving groove on the at least one actuator or on the at least one support, respectively, is expediently open at its end pointing downward toward the housing, so that a retaining element can now enter this opening, which is prevented from moving out of the receiving slot of the receiving groove due to its widening at the end immersed in the receiving groove. In this way, the display foil is now retained to the actuator or the support, respectively, even when torques act on the display foil that would otherwise cause the display foil carrier to detach from the actuator or from the support, respectively.

As already described above, the display foil and the display foil carrier can still protrude slightly from the housing when being in the retracted state. If this is undesirable, i.e. if the entire display foil with display foil carrier is to be stowable in the housing, it is advantageous if the at least one actuator and, if present, the at least one support for pivoting in the upper end portions of the display foil and the display foil carrier in the retracted state into the housing is or are pivotably mounted at the respective first end in the housing.

Due to the pivotal mounting of the actuator or support, respectively, it may be expedient that the second end of the actuator and, if present, the second end of the at least one support are arranged at the upper end portion of the display foil carrier in an articulated manner.

As a result of pivoting of the actuator and/or support, the upper end portion of the display foil and the display foil carrier now curves into the housing. However, the support and the actuator should be positioned as close as possible to the display foil carrier when it is extended together with the display foil. However, such an arrangement is not beneficial to the curvature of the display foil and the display foil carrier in their upper end portions. Therefore, in a further expedient configuration of the invention, it is provided that the first end of the at least one actuator and, if present, the first end of the at least one support can be moved away from the rear side of the display foil carrier in the retracted state of the display foil and the display foil carrier and can be pivoted into the housing in the moved-away position, wherein, in particular in the pivoted state, the degree of curvature of the partial area of the main portion of the display foil and the display foil carrier adjacent to the upper end portion is defined by contact elements arranged in the housing.

As already briefly mentioned above, several actuators can also be used. For example, it is conceivable to use two actuators arranged on both sides of the display foil and the display foil carrier and connected to the upper end portion of the display foil carrier. With such an arrangement of the actuators or also of one actuator and one support, the two actuators or the one support and the one actuator, respectively, can be pivoted in the retracted state in order to bring the protrusion of the display foil and the display foil carrier, which may still be present in the retracted state, out of the housing and into the housing. The lower ends of the actuator and the support would then have to be pivotable as described above, but do not additionally need a translational movement possibility.

When the upper end portions of the display foil and the display foil carrier are pivoted into the housing, said end portions are stowed along a curvature. In order to define and determine the degree of curvature, it is advisable to provide contact elements in the housing that are arranged laterally to the display foil or the display foil carrier, respectively, and support it laterally. The contact elements impart a predetermined minimum permissible curvature to the typically stiffened end portion of the display foil and the display foil carrier. This is because, both in terms of guiding the display foil and the display foil carrier when stowing the display device, it is advantageous in terms of avoiding material fatigue and associated damage to the function of the display foil if the radii of curvature do not fall below a predetermined minimum.

In a further advantageous configuration of the invention, it is provided that the guiding means has two guiding slots opposite each other and that the display foil carrier has lateral edges extending along its main portion, from which guiding pins cooperating with the guiding slot project or protrude laterally for guiding the display foil carrier. The guiding slots act as links on which guiding pins are guided, which in turn protrude on the lateral edge side from the display foil carrier.

Just as the upper end portion of the display foil carrier is stiffened, its main portion may also have a stiffening zone in the lower end region facing away from the upper end portion. Said stiffening zone can be used to anchor or otherwise attach a carrier element thereto, the carrier element in turn carrying a rigid or flexible printed circuit board. This is because the control of the OLED elements of the display foil must be moved along with the display foil and the display foil carrier when the display device is extended and retracted in order to avoid flexible cable connections.

Furthermore, the guiding means can expediently have two opposing guiding bodies which are rotatably mounted and each have a curved outer edge, and that the guiding bodies pivot when the display foil and the display foil carrier are extended and retracted, thereby supporting the display foil carrier on the lateral edge side. Said guiding bodies support the display foil carrier on the lateral edge side and can be used in addition to the guiding pins and the guiding slots of the guiding means. The guiding bodies are mechanically coupled to the display foil carrier for driving the display foil carrier when the display foil and the display foil carrier are retracted.

It may be expedient if the guiding bodies are formed as partial disk bodies extending over an angle of less than 180 degrees or less than 135 degrees or less than 90 degrees. The guiding bodies can thus be designed as semi-circular or quarter-circular disks, so to speak.

As an alternative to partial disk bodies, the guiding bodies may be partial ring bodies extending over an angle of less than 180 degrees or less than 135 degrees or less than 90 degrees.

To enable the guiding bodies to interact mechanically with the display foil carrier during retraction and, if necessary, also during extension, they are expediently provided with driving ends at which they interact with the display foil carrier. At the driving ends of each guiding body, a driving pin can be arranged which protrudes from the lateral edge side of the display foil carrier and immerses into a pin receptacle on the display foil carrier. Here, it is also advantageous if the driving pins of the guiding bodies are immersed as guiding pins in the guiding slots of the guiding means. Thus, in this respect, the driving pin has guiding functions, wherein the display foil carrier may have further guiding pins which may be arranged along its lateral edges of the main portion.

As already described above, the display foil carrier can also help to retract the display foil when the at least one actuator is retracted. The stiffness of the display foil carrier, which is still present despite its flexibility required for deflection in the housing, can be exploited in an advantageous manner. However, it is much safer if the guiding means is provided with a biasing unit for automatically retracting the display foil and the display foil carrier. It is then advantageously provided that the biasing unit is tensible when the at least one actuator is extended and is releasable when the at least one actuator is retracted in order to retract the display foil and the display foil carrier.

The biasing unit can expediently have at least one driving lever with a pivot bearing and a spring tensioning mechanism, e.g. with a leg spring, coil spring or helical spring on its pivot bearing, the at least one driving lever being mechanically coupled to one of the guiding bodies. It is also expedient if the biasing unit has two driving levers, each of which is mechanically coupled to a different one of the guiding bodies.

For further stiffening of the display foil in the extended state, it may also be provided that a stiffening carrier comprising stiffening fins is arranged on the rear side of the display foil carrier facing away from the display foil, whose stiffening fins running transversely to the retraction and extension direction of the display foil and the display foil carrier are fastened to the display foil carrier along strip-shaped regions, and that the at least one retaining element, if present, is arranged on one of the stiffening fins, or that a several retaining elements, if present, are arranged on different ones of the stiffening fins. The individual stiffening fins can be connected over their entire height and/or width to the rear side of the display foil carrier, which is expediently realized via flexible intermediate layers and in an adhesive manner. The stiffening fins may have plastic overmolded cores of a material resistant to bending such as metal. They can be flexibly connected by, for example, living hinges or otherwise designed joints. If retaining elements are provided to retain the display foil and the display foil carrier on the actuator and the support in the extended state, said retaining elements can be arranged on the fins. The same applies to the guiding pins of the guiding means. The previously described guiding bodies can now also support the stiffening fins on the lateral edge side instead of resting against the display foil carrier as previously described.

BRIEF DESCRIPTION OF THE DRAWINGS

The invention is explained in more detail below by means of various exemplary embodiments and with reference to the drawing. In the Figures:

FIGS. 14 to 25 show details of further exemplary embodiments of extendable and retractable displays with various designs for guiding the flexible display when retracting and extending the same.

DETAILED DESCRIPTION OF THE DISCLOSURE

Figure 1:
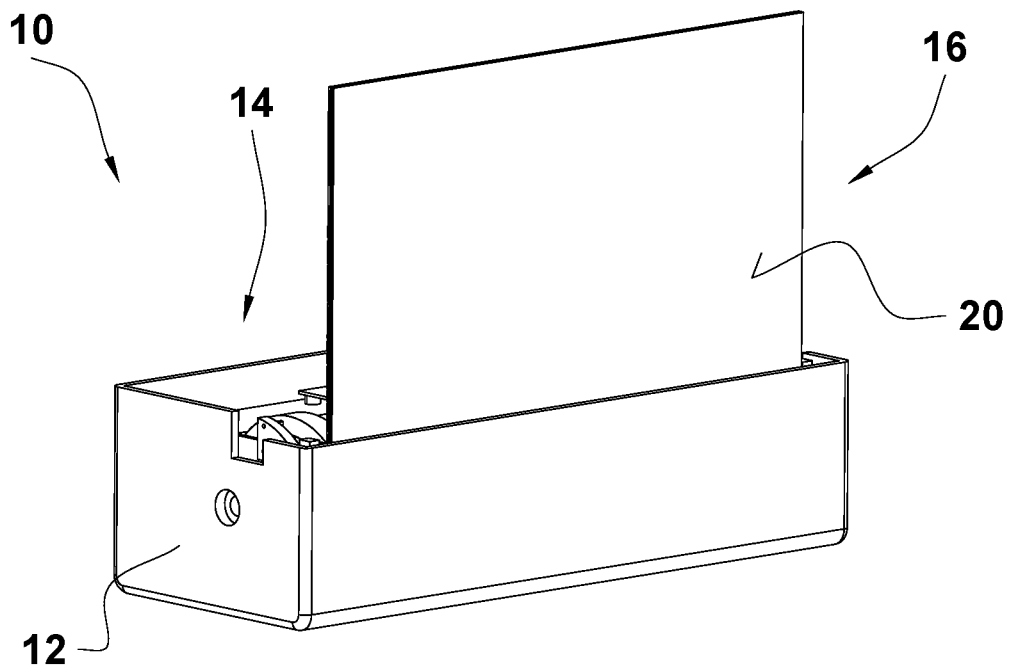
FIGS. 1 to 6 show a first exemplary embodiment of an extendable and retractable display for a vehicle.

FIGS. 1 to 6 show a first exemplary embodiment of an extendable and retractable display device 10 for a vehicle.

The display device 10 comprises a housing 12 having a closed top surface 14 (not shown in the figures) provided with a slot opening from which a display 16 is extendable in a substantially straight manner and into which said display 16 is retractable. Display 16 comprises an OLED display foil 18 defining a display surface 20 that is covered by a protective film. Display foil 18 and cover film 22 are flexible and deflectable along a line of curvature in housing 12. A thin display foil carrier 24 is located on the rear side of display foil 18, which is connected in particular over the entire surface to the rear side of display foil 18 by, for example, an adhesive bond and is additionally stiffened in its upper end portion 26 by, for example, a plate 28. The main portion 30 of display foil carrier 24 adjoins the upper end portion 26. Display foil 18 also comprises an upper end portion 32 and an adjoining main portion 34.

Figure 5:
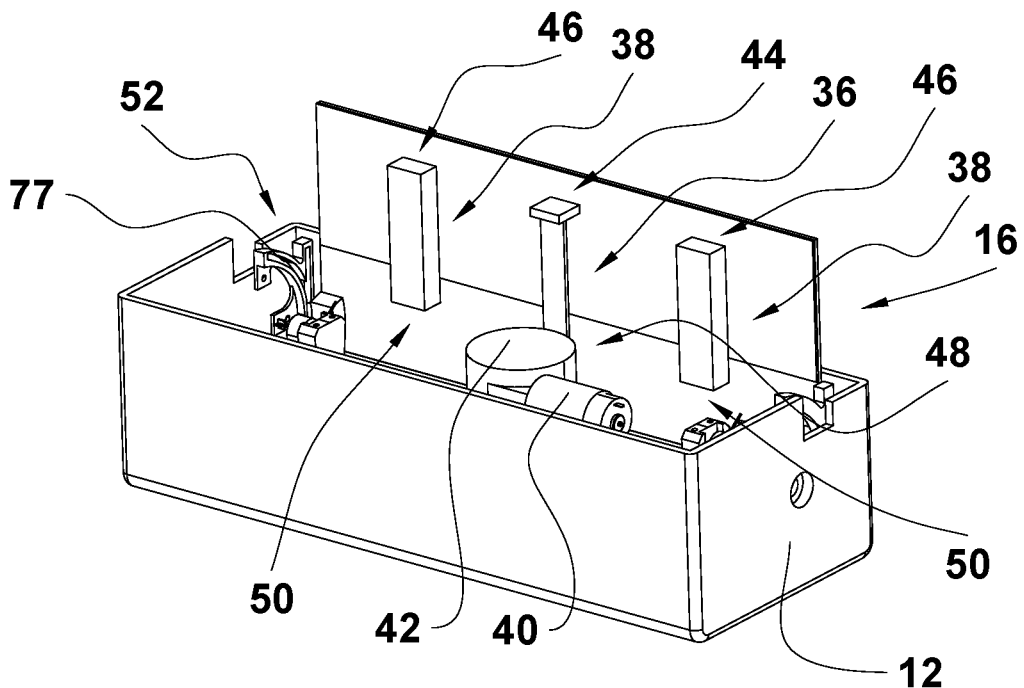
Figure 6:
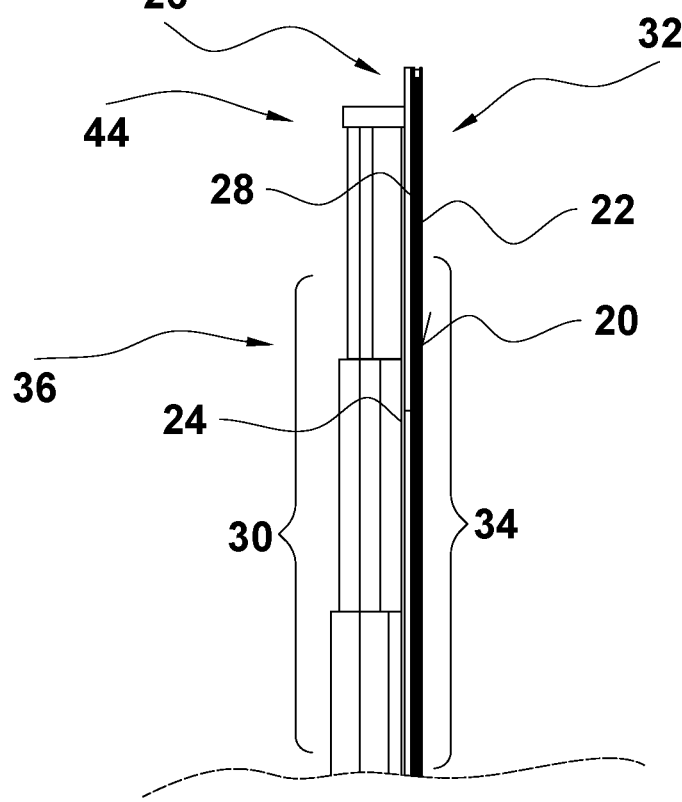

In this exemplary embodiment, on the rear side of display foil carrier 24, a length-variable actuator 36 is arranged in the center, and two supports 38, which are also length-variable, are arranged on both sides of actuator 36. The length-variable actuator 36 is motor-driven; a motor 40 and a transmission 42 are indicated in FIG. 5. The supports 38 are variable in length and extend when actuator 36 extends and contract when the actuator 36 retracts. In this exemplary embodiment, actuator 36 and the supports 38 are telescopic; but other ways of varying the length of said elements can also be realized within the scope of the invention.

The upper ends 44 and 46 of actuator 36 and of the supports 38 are mounted to stiffening plate 28. They are supported at their lower ends 48 and 50, respectively, in housing 12, which is merely indicated in the figures. For example, said elements could be supported on a crossbar extending parallel to display 16 in the housing.

Within housing 12 is a guiding means 52 disposed on either side of the lateral edges 54 of display 16, which ensures that the flexible display 16 is deflected by approximately 90 degrees along a line of curvature 56 during retraction and extension.

Figure 2:
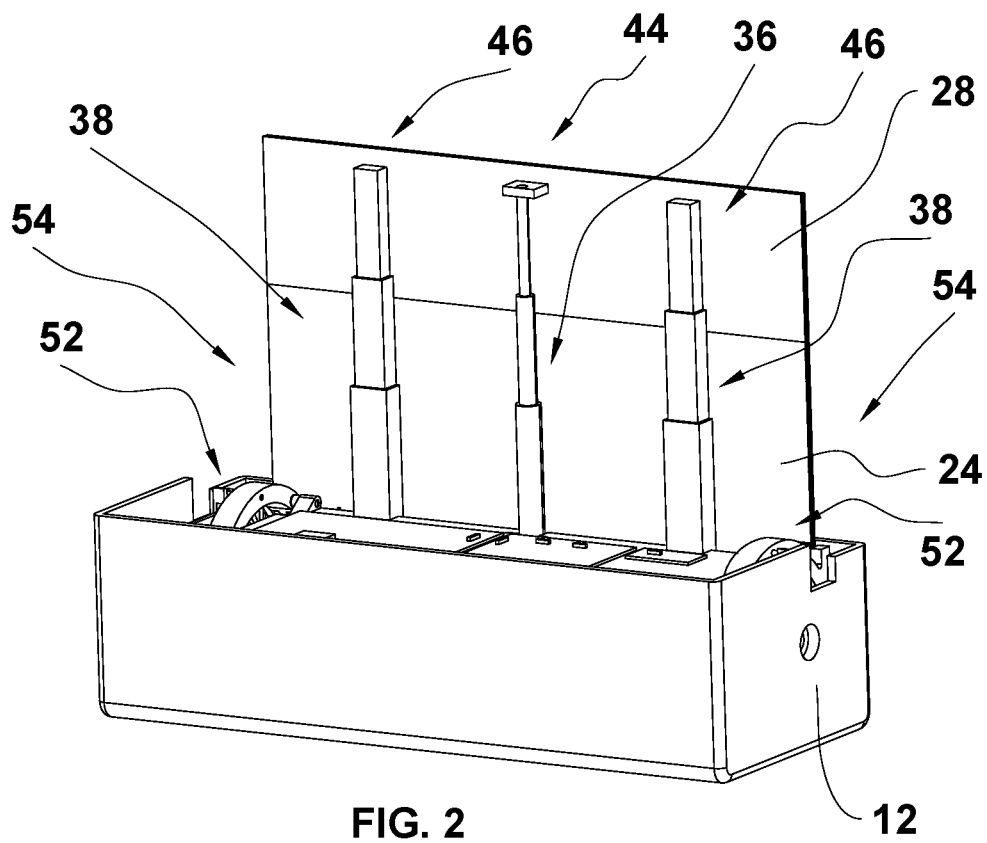
Figure 3:
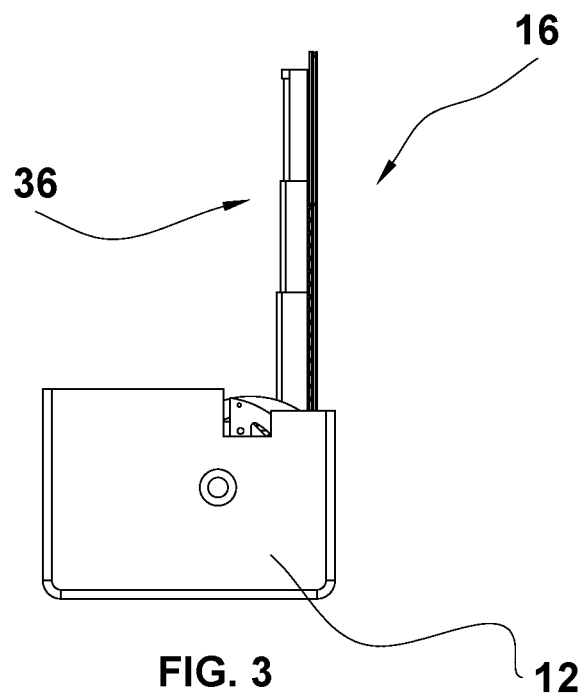
Figure 4:
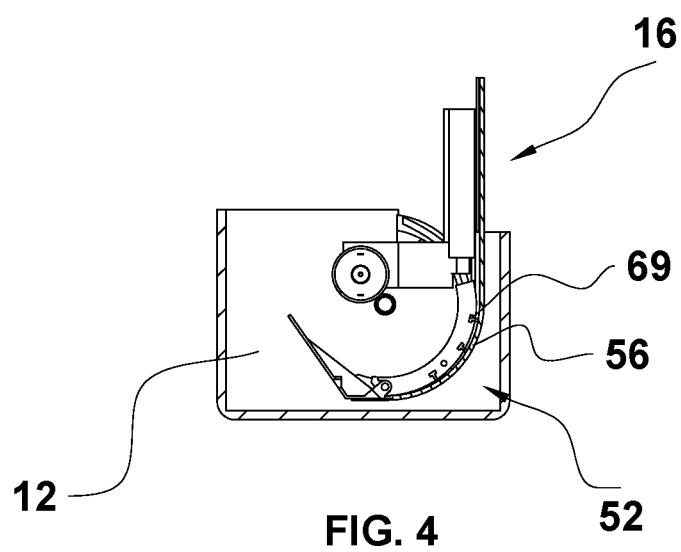

FIGS. 1 to 3 show display device 10 in the fully extended state of its display 16, namely in different views, while FIGS. 4 and 5 show display device 10 in the fully retracted state of display 16. It can be seen that display 16 is not fully submerged in housing 12 when retracted, but protrudes from the non-illustrated opening on top side 14 of display 16.

FIGS. 7 to 11 partly schematically show two further exemplary embodiments of extendable and retractable display devices 10a, 10b. The designs of these exemplary embodiments allow display 16 to be fully stowed within housing 12.

Figure 7:
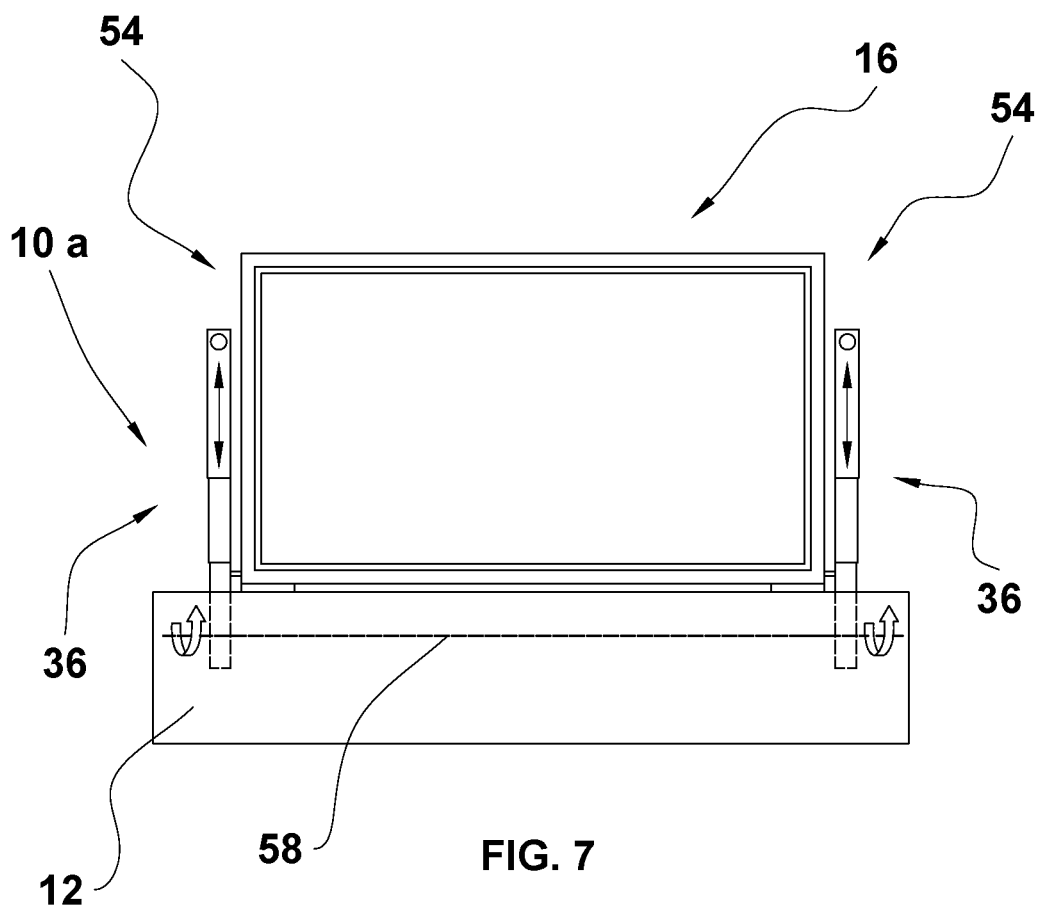
FIG. 7 shows a second exemplary embodiment of an extendable and retractable display for a vehicle, FIGS. 8 to 11 schematically show a retraction and extension mechanism for a third exemplary embodiment of an extendable and retractable display for a vehicle.

For this purpose, according to FIG. 7, display 16 is arranged between two motorically extendable actuators 36 arranged along the lateral edges 54 of display 16. The linear double arrows indicate the extension and retraction of the actuators 36, which are pivotably mounted at their lower ends about pivot axis 58 in housing 12. In the maximum retracted state of display 16, a similar situation results as shown in FIGS. 4 and 5. The upper end of display 16, which then still protrudes upward, can be tilted into housing 12 by pivoting the retracted actuators 36.

FIGS. 8 to 11 schematically show how this folding can be realized when actuator 36 and the supports 38, if present, are located behind display 16, as also shown in the exemplary embodiment of display device 10. FIG. 8 shows the display in the fully extended state. Actuator 36 is shown symbolized. FIG. 9 shows the situation in which actuator 36 is maximally retracted. In order to now be able to fold the protruding area of display 16 into housing 12, the lower end 48 of actuator 36 must first be moved away from display 16 (see arrow 59a), as otherwise there is a risk that display 16 will buckle when actuator 36 is pivoted. After moving away the lower end 48, the situation shown in FIG. 10 results. Now actuator 36 can be pivoted into housing 12 from above (see arrow 59b), for which purpose the upper side 14 can be opened by a blind construction or the like, resulting in the situation shown in FIG. 11. Abutting elements 60 ensure that display 16 undergoes a defined curvature in its upper region when it is fully folded into housing 12, as shown in FIG. 11.

Figure 12:
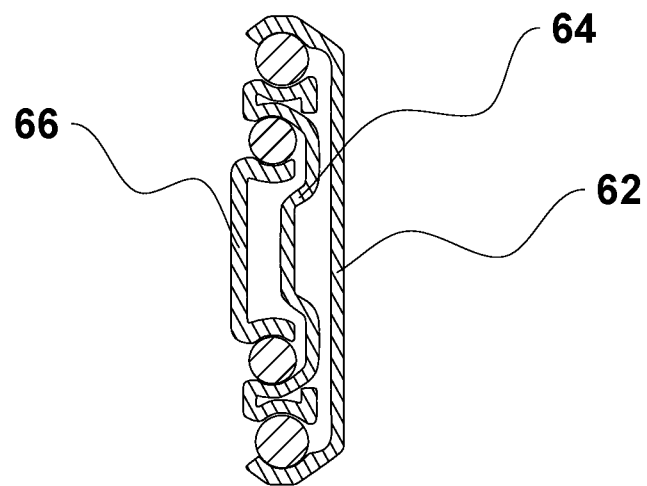
FIGS. 12 and 13 show a cross-sectional view and a perspective view of a length-variable actuator or a length-variable support, respectively.
Figure 13:
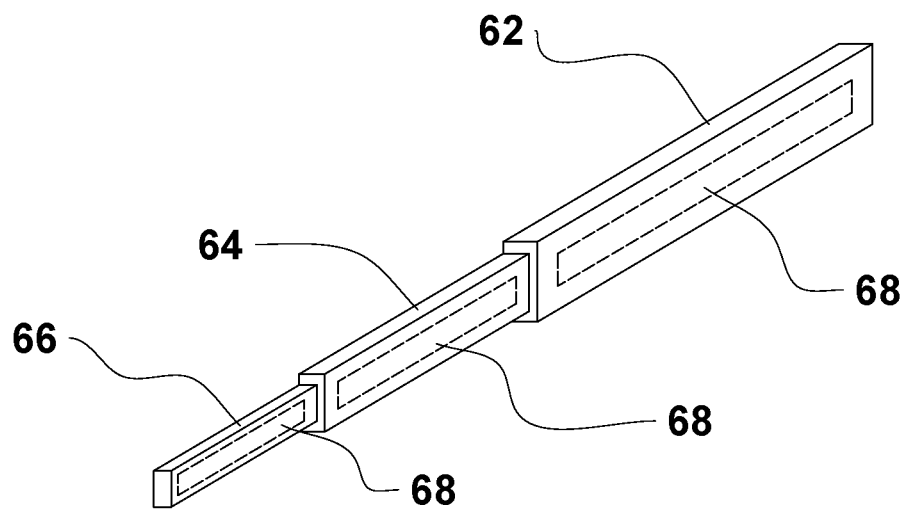

FIGS. 12 and 13 show two views of a telescope design or length variability design, respectively, for both actuator 36 and the supports 38 (FIG. 13 shows this design only schematically). In the exemplary embodiments described here, both elements are provided with three supporting member elements or supporting elements 62, 64, 66, which, as shown in FIG. 12, are each substantially C-shaped as profile elements and are guided against one another, the linear guidance being realized by means of ball bearings. The advantage of the design according to FIG. 12 is that the design is flat. In FIG. 13, a slot 68 is shown in each profile element 62, 64, 66, into which mushroom-head-like retaining elements 69 immerse during extension, which project from the rear side of display foil carrier 24. Thus, display 16 is fixed in the extended state to actuator 36 or to the supports 38, respectively, and prevents it from moving away from these elements unintentionally.

Figure 14:
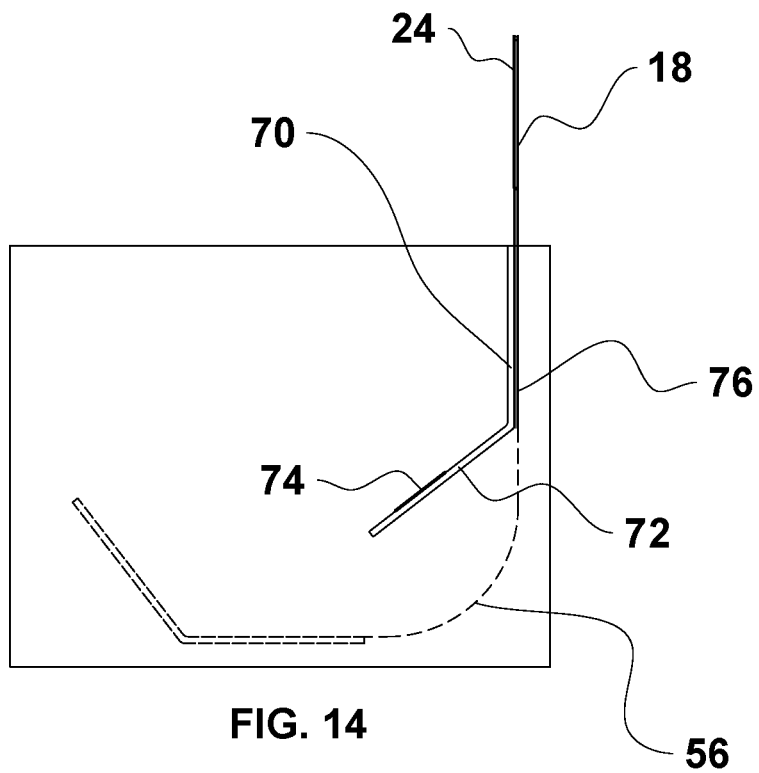
Figure 15:
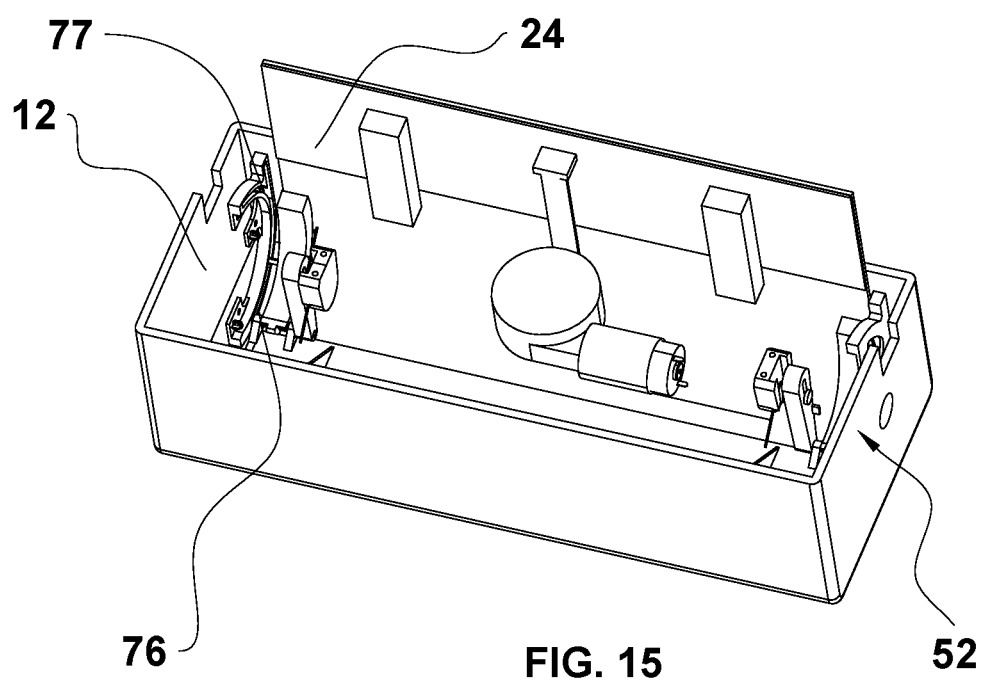

FIG. 14 shows an alternative configuration of display foil carrier 24, which has a stiffening zone 70 in its lower region, from which a plate-shaped carrier element 72 protrudes, on which a circuit board 74 is retained, which has electronics for controlling the pixels of display foil 18. The guiding pins 76 protrude laterally from stiffening zone 70 and immerse into the guiding slots 77 of guiding means 52 to deflect the lower region of display foil carrier 24 along the line of curvature 56 within housing 12 (see also FIG. 15).

Maintaining the curvature of display foil carrier 24 along the line of curvature 56 is assisted by two guiding bodies 78, which are either formed as partial disk bodies 80 (see FIGS. 16 and 17) or partial ring bodies 82 (see FIGS. 18 and 19) and each have a curved outer edge 84. The guiding bodies 78 are biased in the direction of the arrows 86 of FIGS. 16 and 18, respectively, and in addition to maintaining the curvature of display foil carrier 24 and display foil 18, assist in retracting them into housing 12 when actuator 36 is retracted.

Figure 16:
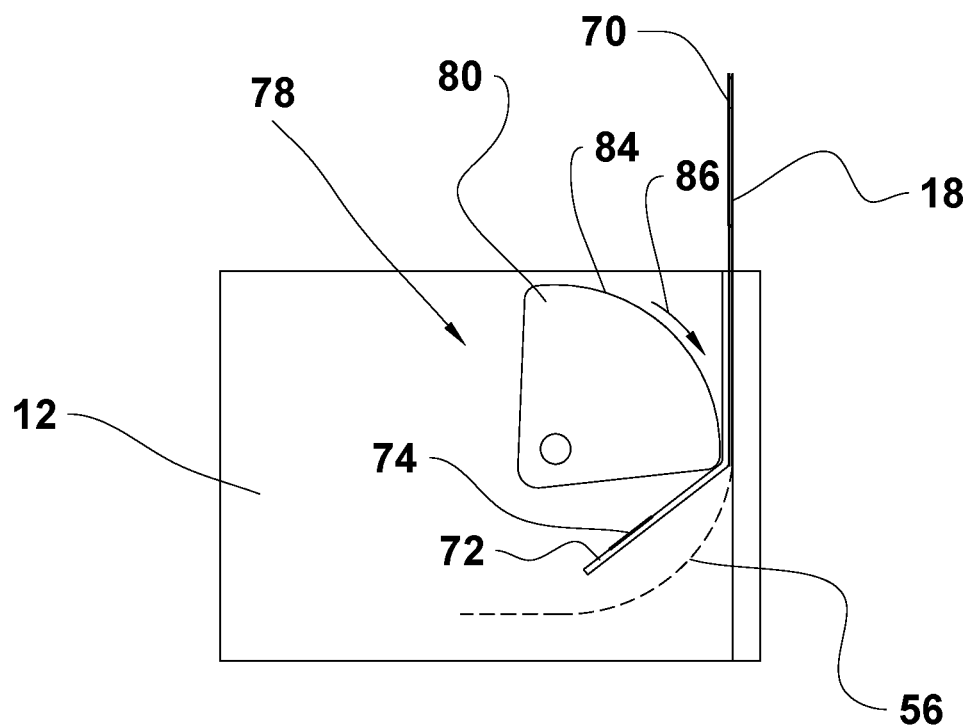
Figure 17:
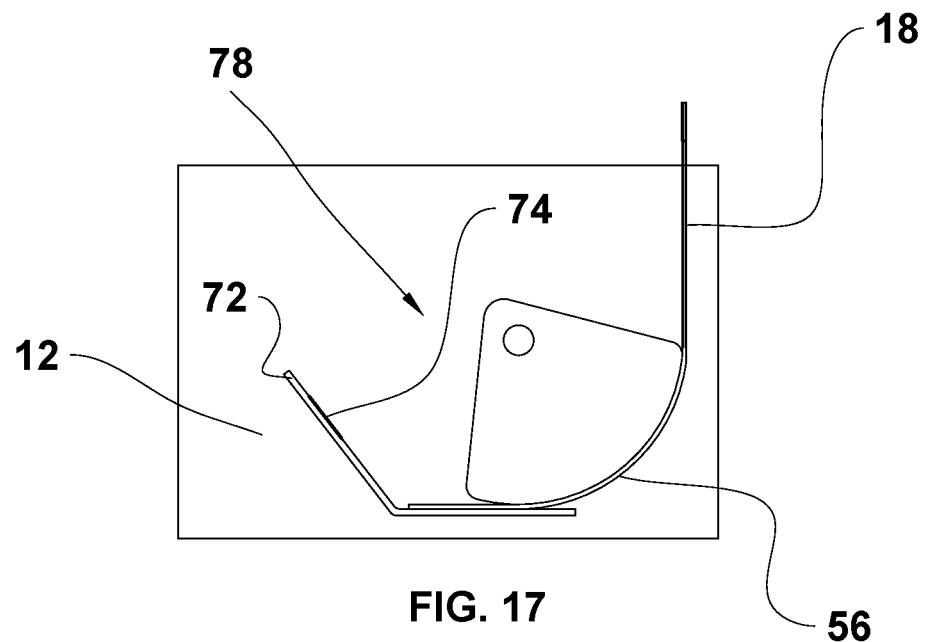
Figure 18:
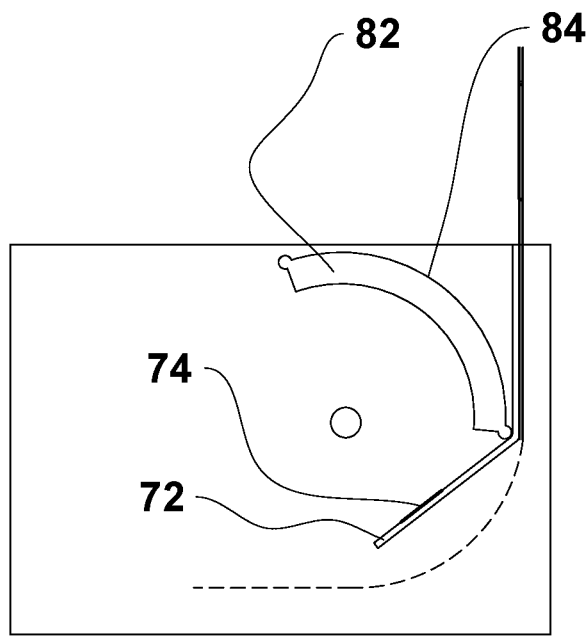

In FIGS. 16 and 18, the respective guiding body 78 is shown in its biased position in which display 16 is fully extended. When actuator 36 is now retracted, the respective guiding body 78 pivots in the direction of arrow 86, with its curved outer edge 84 coming into contact with the lateral edges of display foil carrier 24 and defining and supporting its curvature. In the maximum retracted position of display 16 (see FIGS. 17 and 19), the respective guiding body 78 then assumes the position shown in the respective figure.

The guiding bodies 78 cooperate with, in particular, the lateral edges of display foil carrier 24 by means of driving elements in the form of driving pins, for example, to realize a mechanical coupling between the two so that they can assist in retracting display foil carrier 24 and display foil 18 into housing 12.

Figure 19:
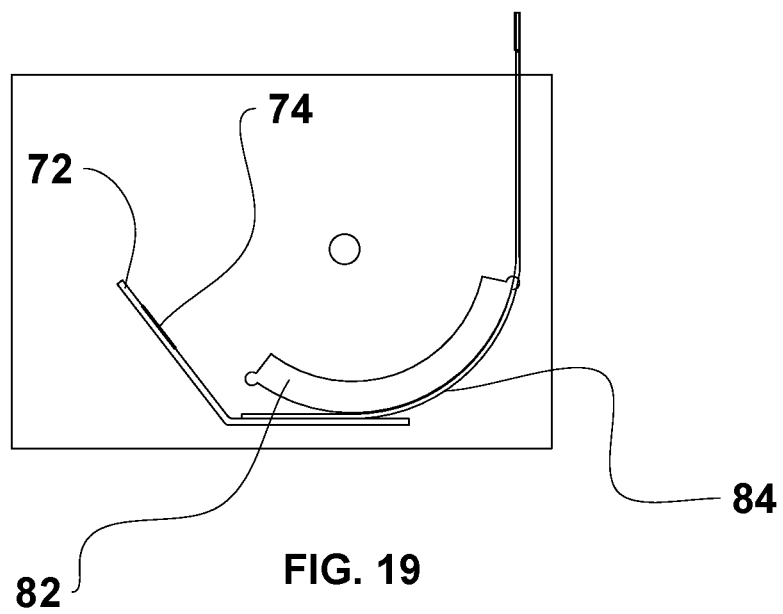

FIGS. 20 to 22 schematically show how the guiding bodies 78, which in this exemplary embodiment are formed as partial ring bodies 82, are pivotable about their driving end 88 which cooperates with display foil carrier 24. FIG. 20 shows the maximum extended position of display 16. The partial ring bodies 82 are shown pivoted upwards. In a first phase of the retraction of display 16, the latter is moved downwards, as indicated by linear arrow 90, whereby the partial ring bodies 82 also move linearly downwards. In doing so, the partial ring bodies 82 in addition pivot about their driving ends 88 in the direction of the arrow, i.e. they perform a superimposed movement consisting of a linear movement and a rotary movement about the center of rotation 93, which therefore also moves laterally downwards. This results in the situation shown in FIG. 21. Starting from this situation, the further retraction of display 16 or its retraction support takes place as shown in FIGS. 18 and 19, so that finally in the maximum retracted state of display 16 the situation according to FIG. 22 results.

Figure 23:
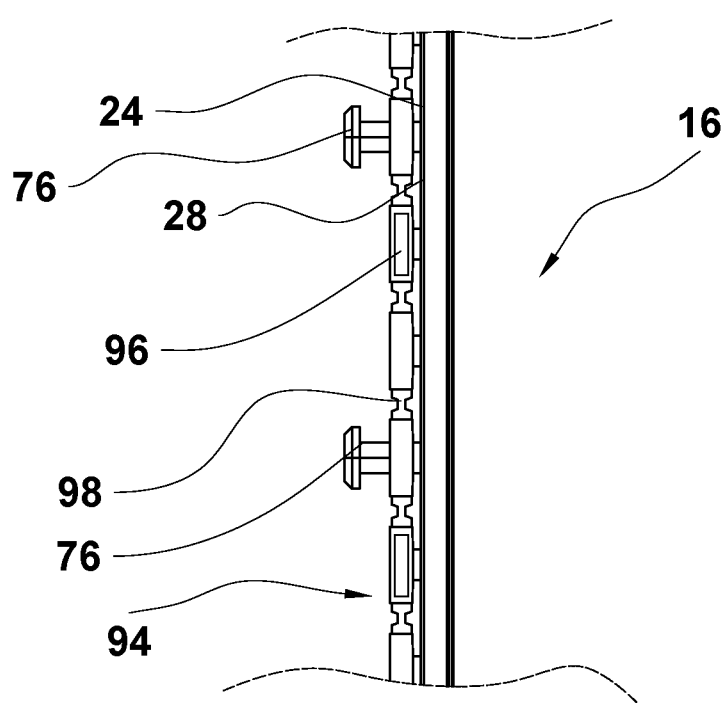

FIG. 23 indicates that display 16 may be further stiffened by the stiffening fins 94. The individual fins 94 may have plastic overmolded cores 96, with the plastic material between neighboring fins 94 being configured as living hinges 98. The individual fins 94 are adhesively bonded to display foil carrier 24 by narrow adhesive strips 100. The articulated connection of the fins 94 to one another can also be realized in a way other than by living hinges 98 made of plastic, for example. For example, purely mechanically operating joints with joint axes are also suitable here.

Figure 24:
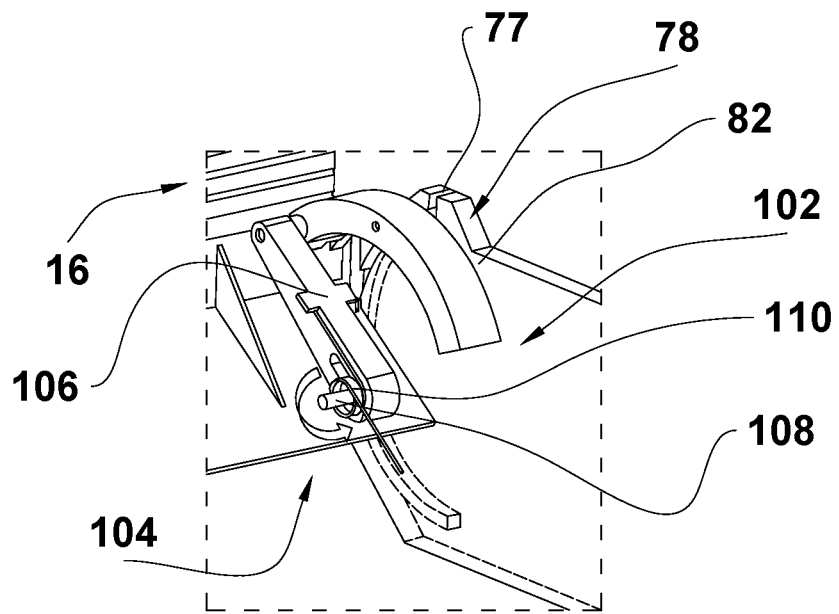
Figure 25:
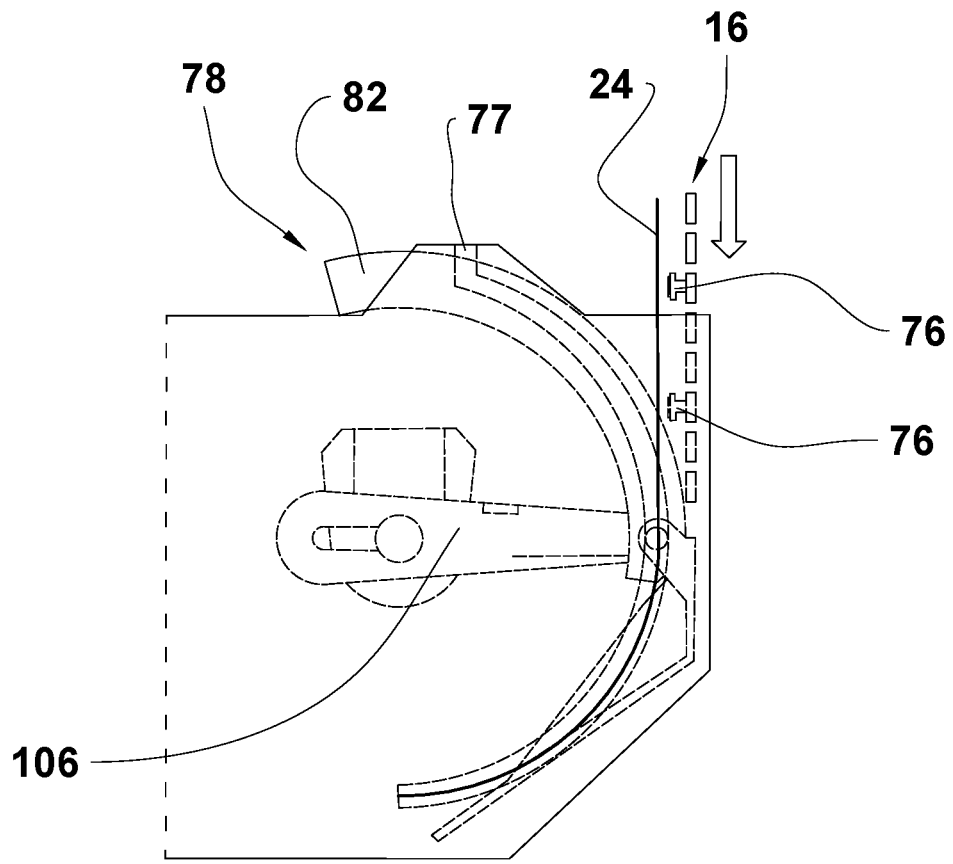

Finally, FIGS. 24 and 25 further show a biasing mechanism for resiliently biasing the guiding bodies 78 to the positions shown in FIGS. 18 and 20, with a biasing unit 102 acting in the direction of the arrows 86. Biasing unit 102 has a spring mechanism 104 that includes one driving lever 106 per guiding body 78. Driving lever 106 is rotatably mounted about an axis of rotation 108, on which a tension spring 110 is arranged. Driving lever 106 is coupled to guiding body 78 and is moved therewith to tension the tension spring 110 when display 16 is extended, which in turn is accomplished by driving actuator 36. In the extended state, in which the guiding bodies 78 assume the positions according to FIGS. 16 and 18, respectively, the tensioning spring 110 is then tensioned so that it assists the retraction of display 16 when actuator 36 is retracted by rotating the guiding bodies 78 therewith.

LIST OF REFERENCE NUMERALS

10 display device
10a display device
10b display device
12 housing
14 upper side of housing
16 display
18 OLED display foil
20 display surface
22 cover film
24 display foil carrier
26 upper end portion of display foil carrier
28 stiffening plate
30 main portion of display foil carrier
32 upper end portion of display foil
34 main portion of display foil
36 actuator
38 support
40 motor
42 transmission
44 upper end of actuator
46 upper end of support
48 lower end of actuator
50 lower end of support
52 guiding means
54 lateral edges of display foil carrier
56 curvature line
58 pivot axis of actuator or support
59a linear arrow
59b rotary arrow
60 abutting element
62 profile element of actuator or support
64 profile element of actuator or support
66 profile element of actuator or support
68 receiving slot of actuator or support
69 retaining element
70 stiffening zone
72 carrier element
74 circuit board
76 guiding pins of the guiding means
77 guiding pins of the guiding means
78 guiding body of the guiding means
80 partial disk body
82 partial ring body
84 outer edge of guiding body
86 arrows
88 driving end of guiding body
90 arrow for linear movement direction of display
92 arrow for pivoting/rotating movement direction of the partial ring body
93 center of rotation of the partial ring body
94 stiffening fin
96 core of stiffening fin
98 living hinges between stiffening fins
100 adhesive strip
102 biasing unit
104 spring mechanism of biasing unit
106 driving lever of biasing unit
108 axis of rotation
110 tension spring

The invention claimed is:

1. An extendable and retractable display device for a vehicle, comprising
a flexible display foil in OLED technology comprising a front side having a display surface and a rear side and an upper end portion adjoined by a main portion of the display foil extending to a lower end of the display foil,
a flexible display foil carrier being attached to the display foil at the rear side thereof or being connected thereto by means of an intermediate layer of, in particular, elastic material and being provided with an upper end portion, which is adjoined by a main portion of the display foil carrier extending to a lower end of the display foil carrier, wherein the upper end portion of the display foil carrier abuts against the upper end portion of the display foil and is or can be stiffened,
a housing into which the display foil together with the display foil carrier is retractable and out of which the display foil together with the display foil carrier is extendable,
at least one motorically drivable, length-variable actuator having a first end supported in and/or on the housing and a second end to which the upper end portion of the display foil carrier is attached, and
a guiding means in the housing for guiding the display foil and the display foil carrier in at least a partial area of their main portions along a line of curvature over less than 180 degrees or less than 135 degrees or less than 90 degrees during an extension and retraction of at least partial areas of the main portions of the display foil and the display foil carrier out of and into the housing by changing the length of the at least one actuator.

2. The extendable and retractable display device according to claim 1, wherein at least one actuator has at least two actuator elements arranged between the two ends, wherein neighboring actuator elements are respectively guided so as to be slidable against and/or into one another.

3. The extendable and retractable display device according to claim 2, wherein the actuator comprises a substantially C-shaped first actuator profile element and is provided with a closed side and an open side, a second actuator profile element which is slidably guided in the first actuator profile element, is also substantially C-shaped, and is provided with a closed side and an open side, the closed side of which faces the closed side of the first actuator profile element, and a third actuator profile element which is slidably guided in the second actuator profile element, is substantially C-shaped, and is provided with a closed side and an open side, the closed side of which covers the open side of the second actuator profile element.

4. The extendable and retractable display device according to claim 1, wherein at least one length-variable support has a first end supported in the housing and a second end to which the upper end area of the display foil carrier is attached.

5. The extendable and retractable display device according to claim 4, wherein the at least one support has at least two support elements arranged between the two ends, wherein neighboring support elements are respectively guided so as to be slidable against and/or into one another.

6. The extendable and retractable display device according to claim 5, wherein the support comprises a substantially C-shaped first support profile element provided with a closed side and an open side, a second support profile element which is slidably guided in the first support profile element, is also substantially C-shaped and is provided with a closed side and an open side, whose closed side faces the closed side of the first support profile element, and a third support profile element, which is slidably guided in the second support profile element, is substantially C-shaped, and is provided with a closed side and an open side, the closed side of which covers the open side of the second support profile element.

7. The extendable and retractable display device according to claim 1, wherein the at least one actuator or at least one of its support elements and/or, if present, the at least one support or at least one of its support elements has an inner side facing the display foil carrier, on which inner side a receiving groove is formed or arranged, wherein at least one retaining element is arranged, protruding from the rear side of the display foil carrier facing away from the display foil, in the main portion of said display foil carrier, specifically on an imaginary line which is opposite the receiving groove when the display foil and the display foil carrier are extended and retracted, and wherein the at least one retaining element immerses into the receiving groove when the display foil and the display foil carrier are extended and moves out of the receiving groove when the display foil and display foil carrier are retracted.

8. The extendable and retractable display device according to claim 7, wherein the at least one retaining element has a widened or angled end facing away from the display foil carrier for engaging behind a receiving slot of the receiving groove.

9. The extendable and retractable display device according to claim 1, wherein the display foil and the display foil carrier at least partly protrude from the housing with their upper end portions when being retracted into the housing.

10. The extendable and retractable display device according to claim 1, wherein the at least one actuator and, if present, the at least one support for pivoting in the upper end portions of the display foil and the display foil carrier in the retracted state into the housing is or are pivotably mounted at the respective first end in the housing.

11. The extendable and retractable display device according to claim 10, wherein the second end of the actuator and, if present, the second end of the at least one support is arranged at the upper end portion of the display foil carrier in an articulated or bendable manner.

12. The extendable and retractable display device according to claim 10, wherein the first end of the at least one actuator and, if present, the first end of the at least one support can be moved away from the rear side of the display foil carrier in the retracted state of the display foil and the display foil carrier and can be pivoted into the housing in the moved-away position, wherein, in particular in the pivoted state, the degree of curvature of the partial area of the main portion of the display foil and the display foil carrier adjacent to the upper end portion is defined by contact elements arranged in the housing.

13. The extendable and retractable display device according to claim 1, wherein two actuators are provided which are arranged on both sides of the display foil and the display foil carrier and are connected to the upper end portion of the display foil carrier.

14. The extendable and retractable display device according to claim 1, wherein an actuator and a support are provided which are arranged on both sides of the display foil and the display foil carrier and are connected to the upper end portion of the display foil carrier.

15. The extendable and retractable display device according to claim 1, wherein the guiding means has two guiding slots opposite each other and wherein the display foil carrier has lateral edges extending along its main portion, from which guiding pins cooperating with the guiding slot project or protrude laterally for guiding the display foil carrier.

16. The extendable and retractable display device according to claim 1, wherein the display foil carrier is provided with a stiffening zone at its end of its main portion facing away from the upper end portion.

17. The extendable and retractable display device according to claim 16, wherein the guiding pins are arranged in the area of the stiffening zone of the main portion of the display foil carrier.

18. The extendable and retractable display device according to claim 16, wherein a carrier element with a rigid or flexible printed circuit board protrudes at an angle from the stiffening zone.

19. The extendable and retractable display device according to claim 1, wherein the guiding means has two opposing guiding bodies which are rotatably mounted and each have a curved outer edge, and wherein the guiding bodies pivot when the display foil and the display foil carrier are extended and retracted, thereby supporting the display foil carrier on the lateral edge side.

20. The extendable and retractable display device according to claim 19, wherein the guiding bodies are mechanically coupled to the display foil carrier for driving the display foil carrier when the display foil and the display foil carrier are retracted.

21. The extendable and retractable display device according to claim 19, wherein the guiding bodies are formed as partial disk bodies extending over an angle of less than 180 degrees or less than 135 degrees or less than 90 degrees.

22. The extendable and retractable display device according to claim 19, wherein the guiding bodies are formed as partial ring bodies extending over an angle of less than 180 degrees or less than 135 degrees or less than 90 degrees.

23. The extendable and retractable display device according to claim 19, wherein each guiding body has a driving end for driving the display foil carrier.

24. The extendable and retractable display device according to claim 23, wherein at the driving end of each guiding body, a driving pin is arranged which protrudes from the lateral edge side of the display foil carrier and immerses into a pin receptacle on the display foil carrier.

25. The extendable and retractable display device according to claim 19, wherein the driving pins of the guiding bodies are immersed as guiding pins into the guiding slots of the guiding means.

26. The extendable and retractable display device according to claim 19, wherein each guiding body is rotatably mounted at its driving end for pivoting into the housing, wherein the axis of rotation extends transversely to the direction of extension and retraction of the display foil (18) and the display foil carrier.

27. The extendable and retractable display device according to claim 1, wherein the guiding means has a biasing unit for automatically retracting the display foil and the display foil carrier or at least for supporting an automatic retraction of the display foil and the display foil carrier, wherein the biasing unit is tensible when the at least one actuator is extended and is releasable when the at least one actuator is retracted in order to retract the display foil and the display foil carrier.

28. The extendable and retractable display device according to claim 27, wherein the biasing unit has at least one driving lever with a pivot bearing and a spring tensioning mechanism, e.g. with a leg spring, coil spring or helical spring on its pivot bearing, and wherein the at least one driving lever is mechanically coupled to one of the guiding bodies.

29. The extendable and retractable display device according to claim 27, wherein the biasing unit has two driving levers, each of which is mechanically coupled to a different one of the guiding bodies.

30. The extendable and retractable display device according to claim 1, wherein a stiffening carrier comprising stiffening fins is arranged on the rear side of the display foil carrier facing away from the display foil, whose stiffening fins running transversely to the retraction and extension direction of the display foil and the display foil carrier are fastened to the display foil carrier along strip-shaped regions, and wherein the at least one retaining element, if present, is arranged on one of the stiffening fins, or wherein several retaining elements, if present, are arranged on different ones of the stiffening fins.

* * * * *